(12) United States Patent
Oh et al.

(10) Patent No.: US 11,276,474 B2
(45) Date of Patent: *Mar. 15, 2022

(54) STORAGE DEVICE MONITORING AND STORING ON CELL COUNTS OF BLOCKS AND OPERATING METHOD THEREOF

(71) Applicant: Samsung Electronics Co., Ltd., Suwon-si (KR)

(72) Inventors: Hyunkyo Oh, Yongin-si (KR); Sangkwon Moon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 24 days.

This patent is subject to a terminal disclaimer.

(21) Appl. No.: 17/113,451

(22) Filed: Dec. 7, 2020

(65) Prior Publication Data
US 2021/0118516 A1    Apr. 22, 2021

Related U.S. Application Data

(63) Continuation of application No. 16/448,545, filed on Jun. 21, 2019, now Pat. No. 10,872,675.

(30) Foreign Application Priority Data

Nov. 14, 2018   (KR) .................. 10-2018-0139728

(51) Int. Cl.
| | | |
|---|---|---|
| G11C 11/34 | (2006.01) | |
| G11C 16/04 | (2006.01) | |
| G11C 16/34 | (2006.01) | |
| G11C 16/16 | (2006.01) | |

(52) U.S. Cl.
CPC ...... *G11C 16/3404* (2013.01); *G11C 16/0466* (2013.01); *G11C 16/16* (2013.01)

(58) Field of Classification Search
CPC .. G11C 16/3404; G11C 16/0466; G11C 16/16
See application file for complete search history.

(56) References Cited

U.S. PATENT DOCUMENTS

| | | | |
|---|---|---|---|
| 7,679,133 | B2 | 3/2010 | Son et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 8,689,082 | B2 | 4/2014 | Oh et al. |

(Continued)

FOREIGN PATENT DOCUMENTS

JP    2013125575 A    6/2013

OTHER PUBLICATIONS

Non-Final Office Action dated May 15, 2020 in U.S. Appl. No. 16/448,545.

(Continued)

*Primary Examiner* — Toan K Le
(74) *Attorney, Agent, or Firm* — Harness, Dickey & Pierce, P.L.C.

(57) ABSTRACT

A storage device includes a non-volatile memory including a plurality of blocks, a buffer memory, and a controller that stores an on-cell count in the buffer memory, the on-cell count indicating a number of memory cells, which are turned on by a read level applied to a reference word line of each of the plurality of blocks, from among memory cells connected to the reference word line.

20 Claims, 9 Drawing Sheets

(56) References Cited

U.S. PATENT DOCUMENTS

| | | |
|---|---|---|
| 9,129,699 B2 | 9/2015 | Suzuki et al. |
| 9,547,571 B2 | 1/2017 | Yang et al. |
| 9,569,142 B2 | 2/2017 | Han |
| 9,916,237 B2 | 3/2018 | Hyun et al. |
| 9,996,299 B2 | 6/2018 | Yang et al. |
| 10,008,277 B2 | 6/2018 | Pang et al. |
| 10,872,675 B2 * | 12/2020 | Oh ............... G11C 16/3427 |
| 2011/0233648 A1 | 9/2011 | Seol et al. |
| 2016/0111165 A1* | 4/2016 | Shim ............... G11C 16/16 |
| | | 365/185.11 |
| 2017/0229186 A1 | 8/2017 | Karakulak et al. |
| 2017/0358346 A1 | 12/2017 | Zhang et al. |
| 2018/0053543 A1* | 2/2018 | Lee ............... G11C 16/10 |
| 2018/0059936 A1 | 3/2018 | Harada |
| 2018/0190348 A1 | 7/2018 | Tokutomi et al. |
| 2018/0286495 A1 | 10/2018 | Oh et al. |
| 2018/0341553 A1 | 11/2018 | Koudele et al. |
| 2019/0295635 A1 | 9/2019 | Kiyooka et al. |

OTHER PUBLICATIONS

Notice of Allowance dated Aug. 20, 2020 in U.S. Appl. No. 16/448,545.

* cited by examiner

STORAGE DEVICE MONITORING AND STORING ON CELL COUNTS OF BLOCKS AND OPERATING METHOD THEREOF

CROSS-REFERENCE TO RELATED APPLICATIONS

This application is a Continuation of U.S. application Ser. No. 16/448,545, filed on Jun. 21, 2019, which claims priority under 35 U.S.C. § 119 to Korean Patent Application No. 10-2018-0139728 filed on Nov. 14, 2018, in the Korean Intellectual Property Office, the entire contents of each of which are incorporated by reference herein in its entirety.

BACKGROUND

Example embodiments of the inventive concepts disclosed herein relate to a storage device and an operating method thereof, and more particularly, relate to a storage device which monitors and stores on-cell counts of blocks and an operating method thereof.

A storage device may include a non-volatile memory. As a capacity of a storage device increases, nowadays, the number of memory cells stacked on a substrate of a non-volatile memory and the number of word lines stacked thereon increase, and the number of bits of data stored in a memory cell increases.

The non-volatile memory deteriorates over time due to various factors depending on a usage pattern of a user, a usage environment, etc. For example, a controller of the storage device may read data stored in memory cells connected to a target word line by using initially set read voltages, and may determine whether an uncorrectable error is present in the read data. A storage device may cope with deterioration by changing an operating condition of the non-volatile memory. In a case where the read data includes an uncorrectable error, the controller may change the initially set read voltages to have levels determined in advance, and may then read data stored in the memory cells connected to the target word line by using read voltages of the changed levels determined in advance instead of the initially set read voltages. The changed operating condition may be set in advance to the storage device only with respect to an average usage pattern and a typical usage environment. However, this manner of coping with deterioration is not appropriate to overcome an issue in which a shift of a threshold voltage distribution of memory cells varies for each word line. Because memory cells may deteriorate by different amounts and/or rates over time based on an actual usage pattern and actual usage environment, the levels determined in advance may not be optimum values capable of coping with various deterioration. Accordingly, an improved storage device and operating method for preventing (or reducing) damage or loss of data due to deterioration of the non-volatile memory is desired.

SUMMARY

Example embodiments of the inventive concepts provide a storage device which monitors and stores on-cell counts of blocks and an operating method thereof.

According to some example embodiments, a storage device includes a non-volatile memory including a plurality of blocks, a buffer memory, and a controller that stores an on-cell count in the buffer memory, the on-cell count indicating a number of memory cells, which are turned on by a read level applied to a reference word line of each of the plurality of blocks, from among memory cells connected to the reference word line.

According to some example embodiments, a storage device includes a non-volatile memory including a plurality of blocks, a buffer memory, and a controller that periodically reads memory cells connected to a reference word line of each of the plurality of blocks by applying a read level to the reference word line, and periodically updates an on-cell count in the buffer memory, the on-cell count indicating a number of memory cells, which are turned on by applying the read level to the reference word line, from among the memory cells connected to the reference word line.

According to some example embodiments, an operating method of a storage device, which includes a non-volatile memory including a plurality of blocks, a buffer memory, and a controller includes sequentially monitoring, by the controller, on-cell counts of the plurality of blocks by reading memory cells connected to reference word lines of the plurality of blocks of the non-volatile memory by applying a read level to the reference word lines, and storing, by the controller, the on-cell counts of the plurality of blocks in the buffer memory, the on-cell counts indicating a number of memory cells, which are turned on by applying the read level to the reference word lines, from among the memory cells connected to the reference word lines.

DETAILED DESCRIPTION

Below, some example embodiments of the inventive concepts will be described in detail and clearly to such an extent that one of ordinary skill in the art may implement the inventive concepts.

Figure 1:
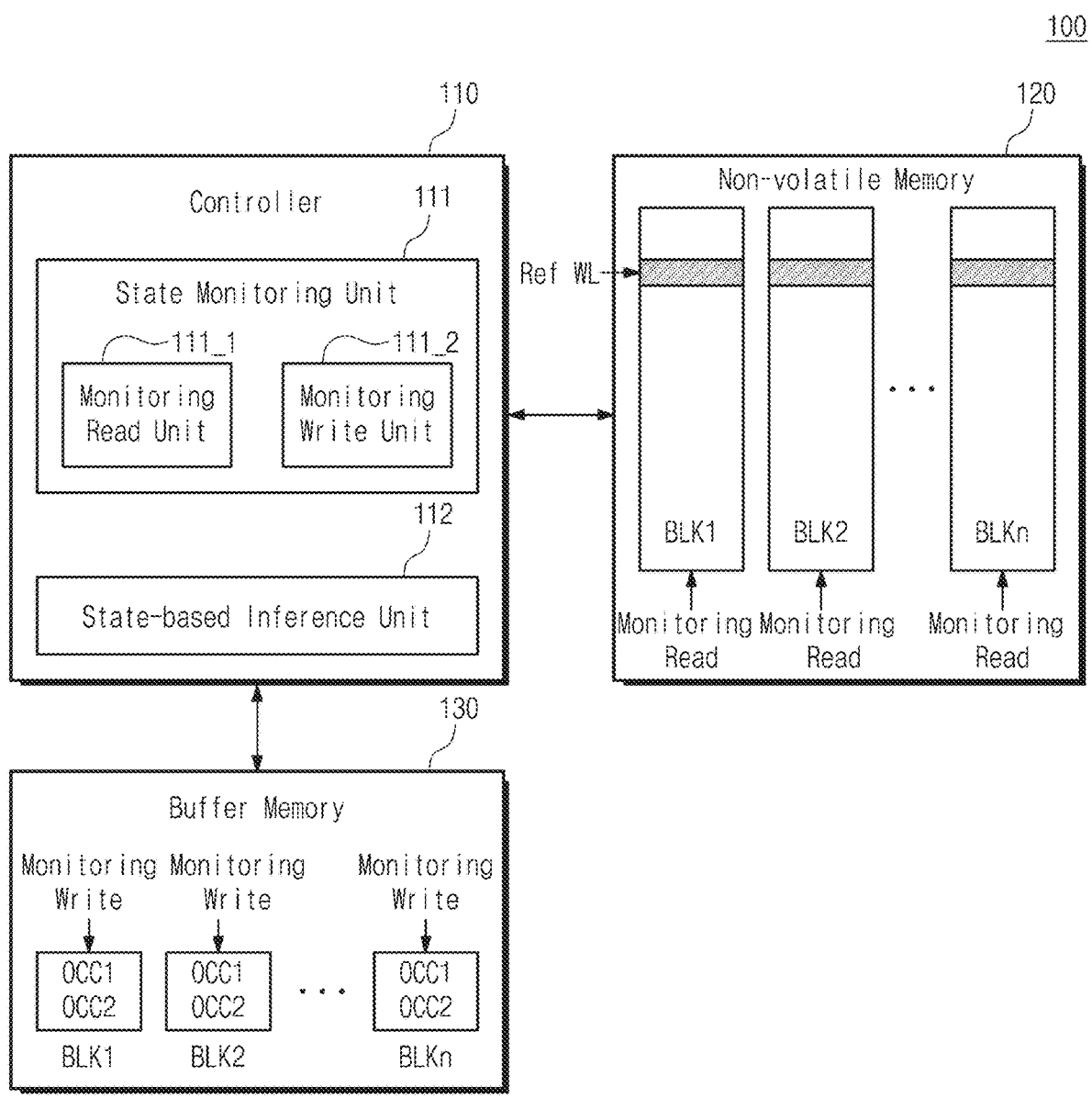
FIG. 1 illustrates a block diagram of a storage device according to some example embodiments of the inventive concepts.

FIG. 1 illustrates a block diagram of a storage device according to some example embodiments of the inventive concepts. A storage device 100 may include a controller 110, a non-volatile memory 120, and a buffer memory 130. For example, the storage device 100 may be a solid state drive (SSD), a memory card, a micro SD card, an embedded multi-media card (eMMC), universal flash storage (UFS), etc., but example embodiments of the inventive concepts are not limited thereto.

The controller 110 may process a request of a host (not illustrated) outside the storage device 100. The controller 110 may perform a write operation, a read operation, and/or an erase operation on the non-volatile memory 120 in response to the request of the host. The controller 110 may temporarily store data to be stored in the non-volatile memory 120 and/or data read from the non-volatile memory 120 in the buffer memory 130. The controller 110 may store information about the non-volatile memory 120 in the buffer memory 130. The controller 110 may manage the storage device 100 by using the buffer memory 130. The controller 110 may be implemented with a system on chip (SoC), an application specific integrated circuit (ASIC), a field programmable gate array (FPGA), etc.

The controller 110 may include a state monitoring unit 111 and a state-based inference unit 112. A unit may refer to a circuit, a processor, etc. The state monitoring unit 111 and the state-based inference unit 112 may be implemented in the form of hardware within the controller 110. Alternatively, the state monitoring unit 111 and the state-based inference unit 112 may be implemented in the form of software, for example, a program code stored in the buffer memory 130 and executable by hardware (e.g., a processor) within the controller 110.

The state monitoring unit 111 may monitor a deterioration state (or aging state) of each of blocks BLK1 to BLKn. To this end, the state monitoring unit 111 may include a monitoring read unit 111_1 which reads a deterioration state of each of the blocks BLK1 to BLKn and a monitoring write unit 111_2 which logs or stores the deterioration state in the buffer memory 130. The monitoring read unit 111_1 and the monitoring write unit 111_2 may be implemented in the form of hardware (e.g., a circuit, a processor, etc.) within the controller 110, or alternatively, in the form of software (e.g., a program code stored in the buffer memory 130) executable by hardware (e.g., a processor) within the controller 110.

The monitoring read unit 111_1 may monitor or check the blocks BLK1 to BLKn (n being a natural number of 2 or more) of the non-volatile memory 120. The monitoring read unit 111_1 may read memory cells connected to a reference word line Ref WL of the blocks BLK1 to BLKn by using a read level. The monitoring read unit 111_1 may calculate an OCC (e.g., an on-cell count) of each of the blocks BLK1 to BLKn based on a read result (e.g., read data output from the non-volatile memory 120).

The OCC may indicate an on-cell count or an off-cell count. The on-cell count OCC may indicate the number of memory cells, which have threshold voltages lower than the read level, from among memory cells connected to the reference word line Ref WL. The on-cell count OCC may indicate the number of memory cells, which are turned on by the read level, from among the memory cells connected to the reference word line Ref WL. The off-cell count OCC may indicate the number of memory cells, which have threshold voltages higher than the read level, from among the memory cells connected to the reference word line Ref WL. The off-cell count OCC may indicate the number of memory cells, which are turned off by the read level, from among the memory cells connected to the reference word line Ref WL. In the following description, it is assumed that the OCC is an on-cell count. However, as described above, the OCC may be used to indicate an off-cell count in some other example embodiments.

The reference word line Ref WL may be determined in advance as any one of word lines of each of the blocks BLK1 to BLKn. The read level may indicate a level of a voltage to be applied to the reference word line Ref WL for acquiring an OCC of each of the blocks BLK1 to BLKn and may be determined in advance.

In some example embodiments, as illustrated in FIG. 1, the number of non-volatile memories 120 is "1", but the number of non-volatile memories 120 may be greater than "1" in some other example embodiments. The monitoring read unit 111_1 may monitor all blocks of all of the non-volatile memories 120 included in the storage device 100. The monitoring read unit 111_1 may repeat a monitoring read operation on each of the blocks of the storage device 100. The monitoring read operation indicates an operation of reading memory cells connected to the reference word line Ref WL by using the read level and calculating an OCC of each of the blocks.

The monitoring write unit 111_2 may store the OCC of each block calculated by the monitoring read unit 111_1 in the buffer memory 130. The monitoring read unit 111_1 may perform the monitoring read operation for each block, and the monitoring write unit 111_2 may perform a monitoring write operation for each block. The monitoring write operation indicates an operation of storing the OCC of each block calculated by the monitoring read unit 111_1 in the buffer memory 130. The monitoring write unit 111_2 may log the OCC of each block in the buffer memory 130 by writing or storing the OCC of each block in the buffer memory 130.

Referring to FIG. 1, the monitoring write unit 111_2 may store two OCCs in the buffer memory 130 for each block. An OCC1 of the first block BLK1 may indicate the number of memory cells, which are turned on by a first read level applied to the reference word line Ref WL of the first block BLK1, from among the memory cells connected to the reference word line Ref WL. An OCC2 of the first block BLK1 may indicate the number of memory cells, which are turned on by a second read level applied to the reference word line Ref WL of the first block BLK1, from among the memory cells connected to the reference word line Ref WL. The first read level and the second read level are different from each other. As in the OCC1 and OCC2 of the first block BLK1, the monitoring write unit 111_2 may store OCCs of the remaining blocks BLK2 to BLKn of the non-volatile memory 120 and OCCs of blocks of another non-volatile memory in the buffer memory 130. However, each of the number of OCCs of one block generated by the monitoring read unit 111_1 and the number of OCCs of one block stored by the monitoring write unit 111_2 may be greater than 2 in some other example embodiments.

The state-based inference unit 112 may infer an operating condition for accessing each of the blocks BLK1 to BLKn based on a deterioration state of each of the blocks BLK1 to BLKn monitored by the state monitoring unit 111. For example, the operating condition may include levels (or magnitudes) of voltages to be applied to the blocks BLK1 to BLKn, time points when voltages are applied to the blocks BLK1 to BLKn, and time intervals when voltages are applied to the blocks BLK1 to BLKn, etc. The state-based inference unit 112 may execute an artificial neural network model for inferring the operating condition, for example.

For example, it is assumed that the controller 110 receives a read request from the host and accesses a target word line of the first block BLK1 of the non-volatile memory 120 for processing the read request. The state-based inference unit 112 may infer, predict, or calculate optimum voltage levels to be applied to the target word line of the first block BLK1 based on the OCC1 and OCC2 of the first block BLK1 stored in the buffer memory 130. The state-based inference unit 112 may input the OCC1 and OCC2 of the first block BLK1 and a number of a target word line indicating a position of the target word line of the first block BLK1 to the artificial neural network model and may acquire optimum read levels calculated by the artificial neural network model. For example, the artificial neural network model may be trained in advance to calculate the optimum read levels based on an OCC and may be stored in the buffer memory 130 in the form of a program code executable by hardware (e.g., a processor) of the controller 110.

The state-based inference unit 112 may further infer any other operating conditions (e.g., program levels and/or erase levels) of the target word line. The target word line is any word line of word lines of the first block BLK1. The target word line may be the same as the reference word line Ref WL or may be different from the reference word line Ref WL.

The non-volatile memory 120 may perform the write operation, the read operation, and/or the erase operation under control of the controller 110. The non-volatile memory 120 may receive a write command, an address, and data from the controller 110 and may write the data in memory cells corresponding to the address according to the write command. The non-volatile memory 120 may receive a read command and an address from the controller 110, may read data from memory cells corresponding to the address, and may output the read data to the controller 110 according to the read command. The non-volatile memory 120 may receive an erase command and an address from the controller 110 and may erase data of memory cells corresponding to the address according to the erase command.

The non-volatile memory 120 may include a plurality of memory cells. For example, a memory cell may include a NAND flash memory cell, a NOR flash memory cell, a resistive random access memory (RRAM) cell, a ferroelectric random access memory (FRAM) cell, a phase change random access memory (PRAM) cell, a magnetic random access memory (MRAM) cell, etc. The memory cells may be divided into the blocks BLK1 to BLKn. Memory cells included in each of the blocks BLK1 to BLKn may correspond to a unit by which data are erased. The non-volatile memory 120 will be described in FIG. 3 in detail.

The buffer memory 130 may include a dynamic random access memory (DRAM), a static random access memory (SRAM), or a tightly coupled memory (TCM). Regardless of the illustration of FIG. 1, the buffer memory 130 may be implemented inside or outside the controller 110. A capacity of the buffer memory 130 may be smaller than a capacity of the non-volatile memory 120, but the buffer memory 130 may have a latency (waiting time), an access time, and an operating speed improved compared with the non-volatile memory 120. The buffer memory 130 may store the OCC1 and OCC2 of each of the blocks BLK1 to BLKn. The number of OCCs stored in the buffer memory 130 for each block may be at least "2", and may be determined based on the number of non-volatile memories 120 included in the storage device 100, the number of blocks BLK1 to BLKn included in each of the non-volatile memories 120, the number of read levels, etc.

The buffer memory 130 may further store any other information relating to the non-volatile memory 120, in addition to the OCC. For example, information or a program for controlling or managing the non-volatile memory 120, a mapping table indicating a relationship between a logical address of the host and a physical address of the non-volatile memory 120, data to be stored in the non-volatile memory 120, data output from the non-volatile memory 120, etc. may be further stored in the buffer memory 130. The data and/or information stored in the buffer memory 130 may be backed up to the non-volatile memory 120 by the controller 110.

Figure 2:
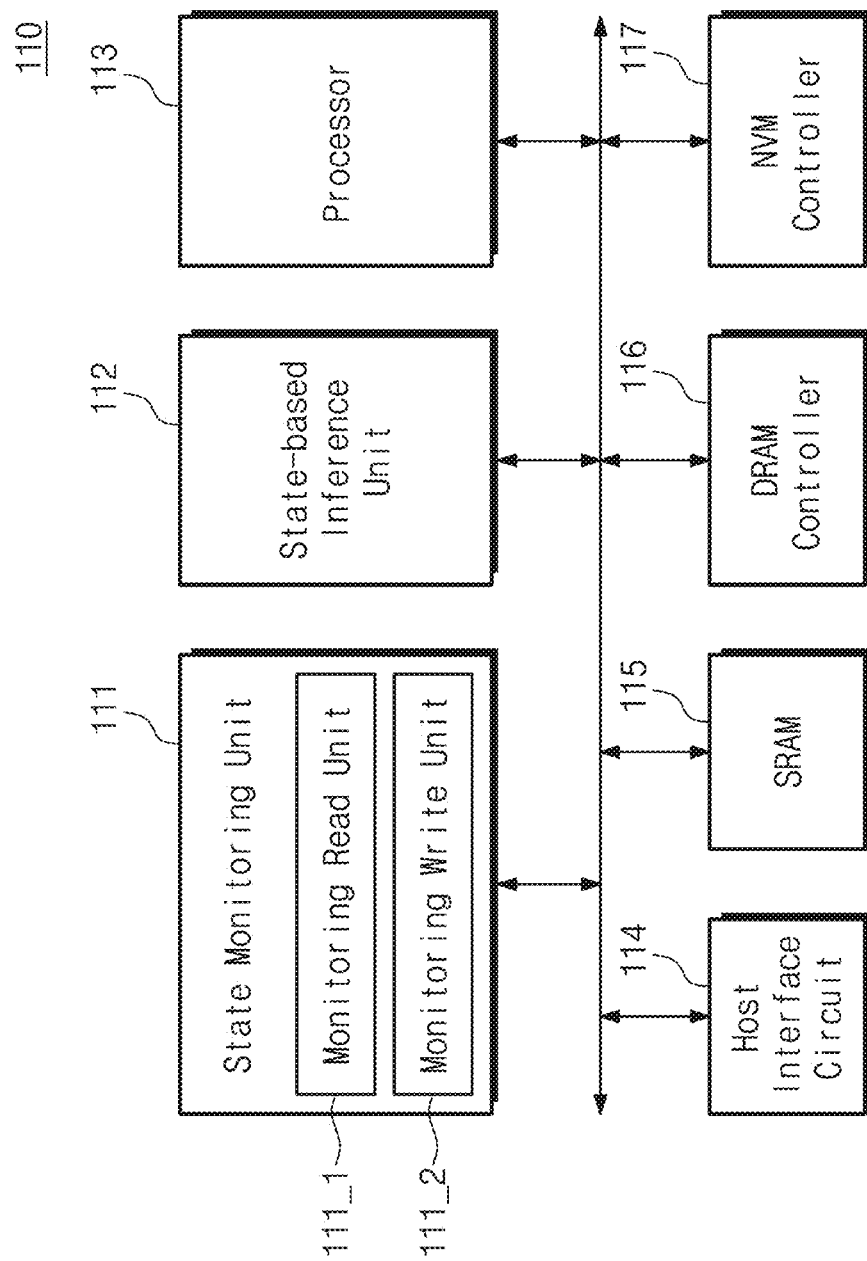
FIG. 2 illustrates a block diagram of a controller of FIG. 1.

FIG. 2 illustrates a block diagram of a controller of FIG. 1. The controller 110 may further include a processor 113, a host interface circuit 114, an SRAM 115, a DRAM controller 116, and an NVM controller 117, in addition to the state monitoring unit 111 and the state-based inference unit 112.

The processor 113 may control an operation of the controller 110, and may perform various logical operations. For example, the processor 113 may include a central processing unit (CPU), a graphics processing unit (GPU), a neural processing unit (NPU), a digital signal processor (DSP), etc., and the number of processors 113 may be at least "2" (e.g., a multi-core processor). In some example embodiments, as illustrated in FIG. 2, the state monitoring unit 111, the state-based inference unit 112, and the processor 113 are independent of each other, but the state monitoring unit 111 and the state-based inference unit 112 may be integrated in the processor 113 of the controller 110 in some other example embodiments. For example, in the case where the state monitoring unit 111 and the state-based inference unit 112 are implemented in the form of software, the processor 113 may execute a program code in which operations of the state monitoring unit 111 and the state-based inference unit 112 are described, and which is stored in the SRAM 115, a DRAM (not shown), or the buffer memory 130 (e.g., including the TCM).

The host interface circuit 114 may communicate with an external host (not shown) under control of the processor 113. The host interface circuit 114 may use at least one of various communication manners such as a universal serial bus (USB) manner, a serial AT attachment (SATA) manner, a serial attached SCSI (SAS) manner, a high speed interchip (HSIC) manner, a small computer system interface (SCSI) manner, a peripheral component interconnection (PCI) manner, a PCI express (PCIe) manner, a non-volatile memory express (NVMe) manner, a universal flash storage (UFS) manner, a secure digital (SD) manner, a multimedia card (MMC) manner, and/or an embedded MMC (eMMC) manner.

The SRAM 115 may be used as a cache memory of the processor 113. The SRAM 115 may store codes and commands which the processor 113 will execute. The SRAM 115 may store data processed by the processor 113. A program code in which operations of the state monitoring unit 111 and the state-based inference unit 112 are described, a flash translation layer FTL, and/or various memory management modules may be stored in the SRAM 115. The flash translation layer FTL may perform various functions for the non-volatile memory 120, such as address mapping, garbage collection, and/or wear leveling, for example.

The DRAM controller 116 may control a DRAM (not shown) included in the storage device 100 under control of the processor 113. For example, the DRAM controller 116 may communicate with the DRAM in a direct memory access (DMA) manner. The DRAM which is included in the storage device 100 and communicates with the DRAM controller 116 may configure the buffer memory 130 of FIG. 1 together with the SRAM 115 and/or the TCM. The DRAM controller 116 may be implemented in the form of hardware (e.g., a digital circuit, a chip, an integrated circuit, a microprocessor, etc.).

The NVM controller 117 may control the non-volatile memory 120 under control of the processor 113. The NVM controller 117 may provide a command and an address to the non-volatile memory 120 through an input/output channel and may exchange data with the non-volatile memory 120. The NVM controller 117 may be implemented in the form of hardware (e.g., a digital circuit, a chip, an integrated circuit, a microprocessor, etc.).

The NVM controller 117 may control the non-volatile memory 120 so that the non-volatile memory 120 reads memory cells connected to a reference word line of each of the blocks BLK1 to BLKn by using a read level under control of the state monitoring unit 111 or the processor 113. The NVM controller 117 may receive a read result or read data from the non-volatile memory 120 and may provide the read result or the read data to the state monitoring unit 111. The NVM controller 117 may control the non-volatile memory 120 so that the non-volatile memory 120 reads memory cells connected to a target word line by using optimum read levels under control of the state-based inference unit 112 or the processor 113. The NVM controller 117 may receive data, which are read based on the optimum read levels, from the non-volatile memory 120.

Figure 3:
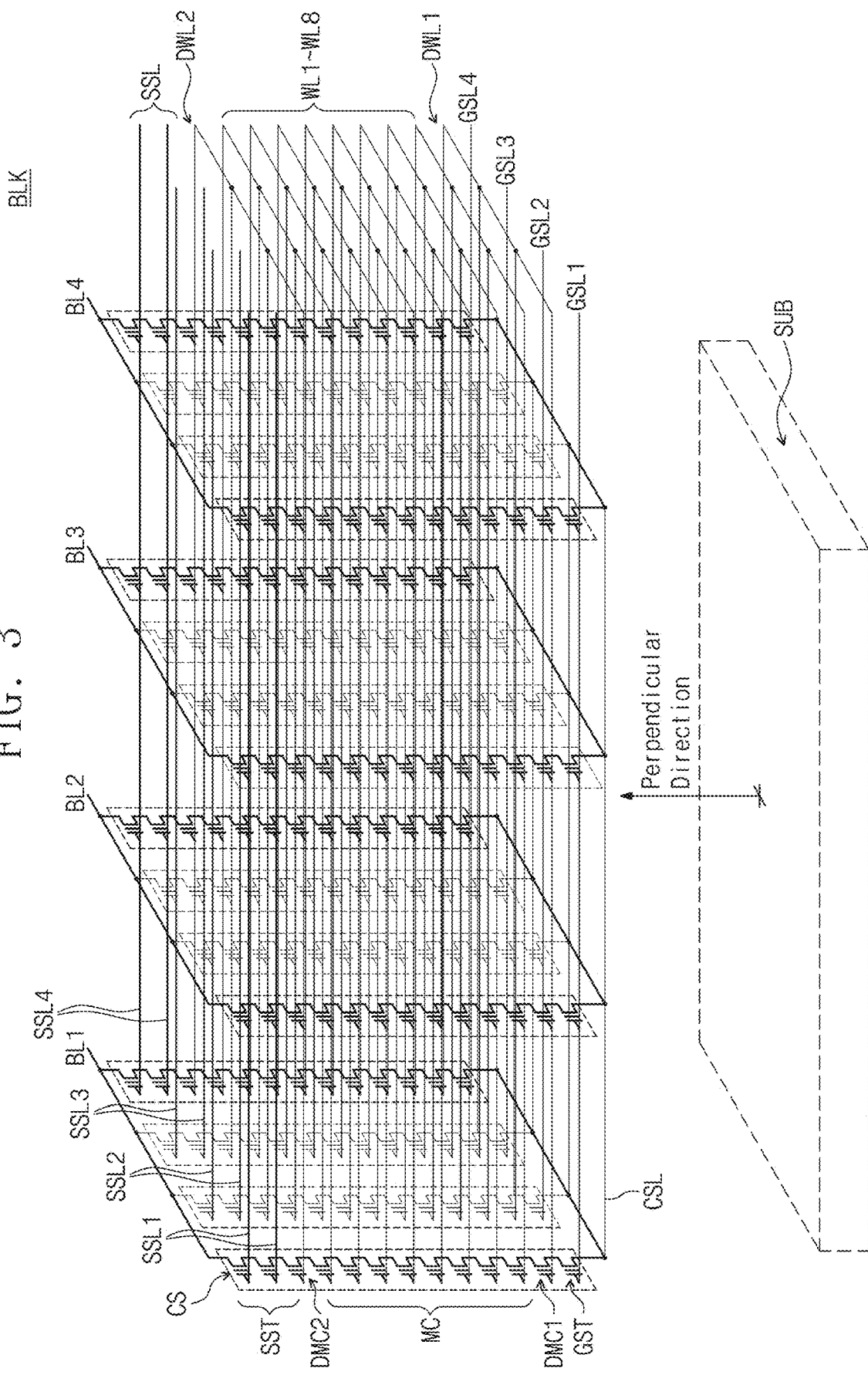
FIG. 3 illustrates a block of a non-volatile memory device of FIG. 1 in detail.

FIG. 3 illustrates a block of a non-volatile memory device of FIG. 1 in detail. A block BLK of FIG. 3 may be one of the blocks BLK1 to BLKn of FIG. 1. A plurality of cell strings CS may be arranged on a substrate SUB. The plurality of cell strings CS may be connected in common to a common source line CSL formed on (or in) the substrate SUB. A location of the substrate SUB is exemplified to help understand a structure of the block BLK. In some example embodiments, the common source line CSL is connected to lower ends of the cell strings CS. However, it is sufficient that the common source line CSL is electrically connected to the lower ends of the cell strings CS, and some other example embodiments are not limited to the case that the common source line CSL is physically located at the lower ends of the cell strings CS. In some example embodiments, the cell strings CS are arranged in a four-by-four matrix. However, the number of cell strings CS in the block BLK may increase or decrease in some other example embodiments.

Cell strings of each row may be connected to a corresponding one of first to fourth ground selection lines GSL1 to GSL4 and a corresponding one of first to fourth string selection lines SSL1 to SSL4. Cell strings of each column may be connected to a corresponding one of first to fourth bit lines BL1 to BL4. For ease of illustration, cell strings that are connected to the second and third ground selection lines GSL2 and GSL3 or the second and third string selection lines SSL2 and SSL3 are depicted to be blurry.

Each cell string CS may include at least one ground selection transistor GST connected to a corresponding ground selection line (one of GSL1 to GSL4), a first dummy memory cell DMC1 connected to a first dummy word line DWL1, a plurality of memory cells MC respectively connected to a plurality of word lines WL1 to WL8, a second dummy memory cell DMC2 connected to a second dummy word line DWL2, and string selection transistors SST respectively connected to string selection lines SSL (one of SSL1 to SSL4). In each cell string CS, the ground selection transistor GST, the first dummy memory cell DMC1, the memory cells MC, the second dummy memory cell DMC2, and the string selection transistors SST may be serially connected to each other along a direction perpendicular to the substrate SUB and may be sequentially stacked along the direction perpendicular to the substrate SUB. Numbers "1" to "8" of the word lines WL1 to WL8 may indicate distances between the word lines WL1 to WL8 and the substrate SUB or locations of the word lines WL1 to WL8, in a perpendicular direction. For example, a number of a word line may be also referred to as an "address" of the word line.

In some example embodiments, as illustrated in FIG. 3, one or more dummy memory cells (e.g., DMC1) may be arranged between the ground selection transistor GST and the memory cells MC in each cell string CS. In each cell string CS, one or more dummy memory cells (e.g., DMC2) may be arranged between the string selection transistors SST and the memory cells MC. In each cell string CS, one or more dummy memory cells may be arranged between the memory cells MC. The dummy memory cells may have the same structure as the memory cells MC and may not be programmed (e.g., program inhibited) or may be programmed differently from the memory cells MC. For example, when memory cells are programmed to form two or more threshold voltage distributions, the dummy memory cells may be programmed to have one threshold voltage distribution range or to have threshold voltage distributions of which the number is less than that of the memory cells MC.

Memory cells of the cell strings CS that are located at the same height (or order) from the substrate SUB or the ground selection transistor GST may be electrically connected in common. Memory cells of the cell strings CS that are arranged at different heights (or orders) from the substrate SUB or the ground selection transistor GST may be electrically separated from each other. In some example embodiments, as shown in FIG. 2, memory cells of the same height (or order) are connected to the same word line (one of WL1 to WL8). However, in some other example embodiments, the memory cells of the same height (or order) may be directly connected to each other in a plane where the memory cells are formed or may be indirectly connected to each other through another layer such as a metal layer.

Memory cells which correspond to a string selection line (or ground selection line) and a word line may configure a page. A write operation and/or a read operation may be performed by the page. In each page, each memory cell may store two or more bits. Bits that are written in memory cells belonging to one page may form logical pages. For example, k-th bits that are respectively written in memory cells of each page may form a k-th logical page.

The block BLK may be provided at a three-dimensional (3D) memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In some example embodiments, the 3D memory array includes vertical cell strings CS (or NAND strings) that are vertically oriented so that at least one memory cell is located over another memory cell. The at least one memory cell may comprise a charge trap layer. Each cell string may further include at least one string selection transistor SST placed over the memory cells MC. The at least one string selection transistor SST may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 4:
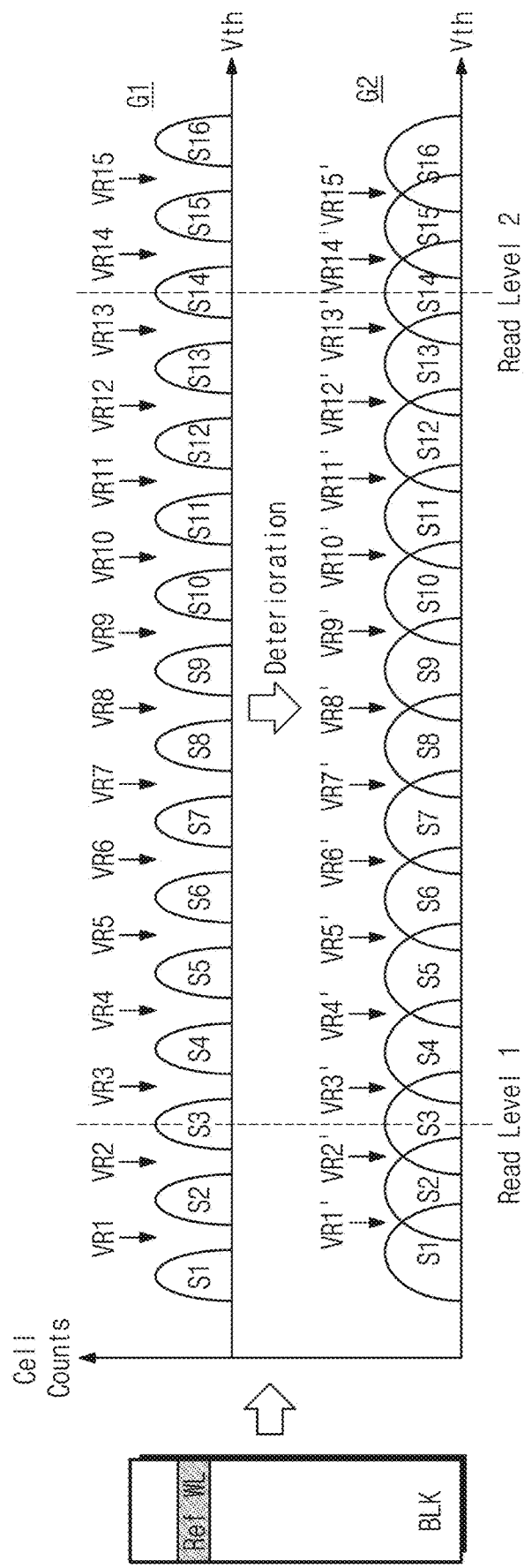
FIG. 4 illustrates graphs indicating a shift of threshold voltage distributions of memory cells of FIG. 3.

FIG. 4 illustrates graphs indicating a shift of threshold voltage distributions of memory cells of FIG. 3. Graphs G1 and G2 illustrate distributions of threshold voltages of memory cells connected to the reference word line Ref WL. In FIG. 4, a horizontal axis represents threshold voltages of memory cells, and a vertical axis represents cell counts, that is, the number of memory cells.

One or more bits may be programmed in each of the memory cells connected to the reference word line Ref WL. A memory cell may be classified as a single level cell (SLC), a multi-level cell (MLC), a triple level cell (TLC), or a quad level cell (QLC), for example, depending on the number of bits stored in the memory cell. The memory cell may have one of a plurality of states depending on the number of bits stored in the memory cell. Each of the plurality of states may be defined as a range of a threshold voltage. In FIG. 4, it is assumed that a memory cell is the QLC and a threshold voltage of the memory cell may be programmed to one of 16 states S1 to S16.

After data are written in the memory cell, disturb deterioration and/or retention deterioration may occur at the memory cell. The disturb deterioration refers to a phenomenon in which threshold voltages of memory cells vary with programming, reading, erasing, coupling, etc. generated around the memory cells. The retention deterioration refers a phenomenon in which threshold voltages of memory cells vary as charges trapped in charge trap layers of the memory cells are discharged over time. Since a threshold voltage of a memory cell is shifted due to the deterioration of the memory cell, data of the memory cell may not be read by using the read levels initially determined (e.g., the deterioration may cause damage or loss of data).

In the case where the memory cells represent threshold voltage distributions such as the graph G1, optimum read levels for reading data stored in the memory cells may be VR1 to VR15. The graph G1 may be changed or shifted to the graph G2 due to the deterioration. In the case where the memory cells represent threshold voltage distribution such as the graph G2, optimum read levels for reading data stored in the memory cells may be VR1' to VR15', not VR1 to VR15.

In some example embodiments, the state monitoring unit 111 may apply first and second read levels Read Level 1 and Read Level 2 for acquiring the OCC1 and the OCC2 to a reference word line and may read memory cells connected to the reference word line. Here, the first and second read levels for acquiring the OCC1 and the OCC2 may be different from the read levels VR1 to VR15 or VR1' to VR15' for reading data. For example, each of the first and second read levels for acquiring the OCC1 and the OCC2 may be applied to a word line according to an SLC read operation. In contrast, the read levels VR1 to VR15 or VR1' to VR15' for reading data may be applied to a word line according to a QLC read operation.

The state monitoring unit 111 may acquire the OCC1 and the OCC2 of the reference word line. For example, the state monitoring unit 111 may acquire the OCC1 and the OCC2 by using the first and second read levels when memory cells form threshold voltage distributions of the graph G1. Also, the state monitoring unit 111 may acquire the OCC1 and the OCC2 by using the first and second read levels when memory cells form threshold voltage distributions of the graph G2. The state monitoring unit 111 may monitor a deterioration state of memory cells based on variations in the OCC1 and the OCC2 according to a change of the graph G1 to the graph G2 due to the deterioration.

The state-based inference unit 112 may infer the optimum read levels VR1 to VR15 of the reference word line based on the OCC1 and the OCC2 associated with the graph G1. Also, the state-based inference unit 112 may infer the optimum read levels VR1' to VR15' of the reference word line based on the OCC1 and the OCC2 associated with the graph G2. The state-based inference unit 112 may infer optimum read levels of a word line other than the reference word line, based on the OCC1, the OCC2, and a number of the other word line. Since the state-based inference unit 112 may infer optimum read levels based on the OCC1 and the OCC2 representing a deterioration state of a block, the number of read retry operations in which a read operation is repeated while changing read levels and the number of read reclaim operations in which data of a block are backed up to another block may decrease.

In some example embodiments, the first and second read levels may be within a range of threshold voltage levels of the memory cells connected to the reference word line. The number of first and second read levels for acquiring an OCC may be less than the number of read levels VR1 to VR15 or VR1' to VR15' for determining data of memory cells. For example, the first read level may be determined in advance depending on a correlation with lower read levels of the read levels VR1 to VR15 or VR1' to VR15' for reading data of memory cells. For example, the second read level may be determined in advance depending on a correlation with upper read levels of the read levels VR1 to VR15 or VR1' to VR15' for reading data of memory cells. The read levels VR1 to VR15 or VR1' to VR15' for reading data of memory cells may be classified into the lower read levels and the upper read levels, and the lower read levels and the upper read levels may be different from each other.

Figure 5:
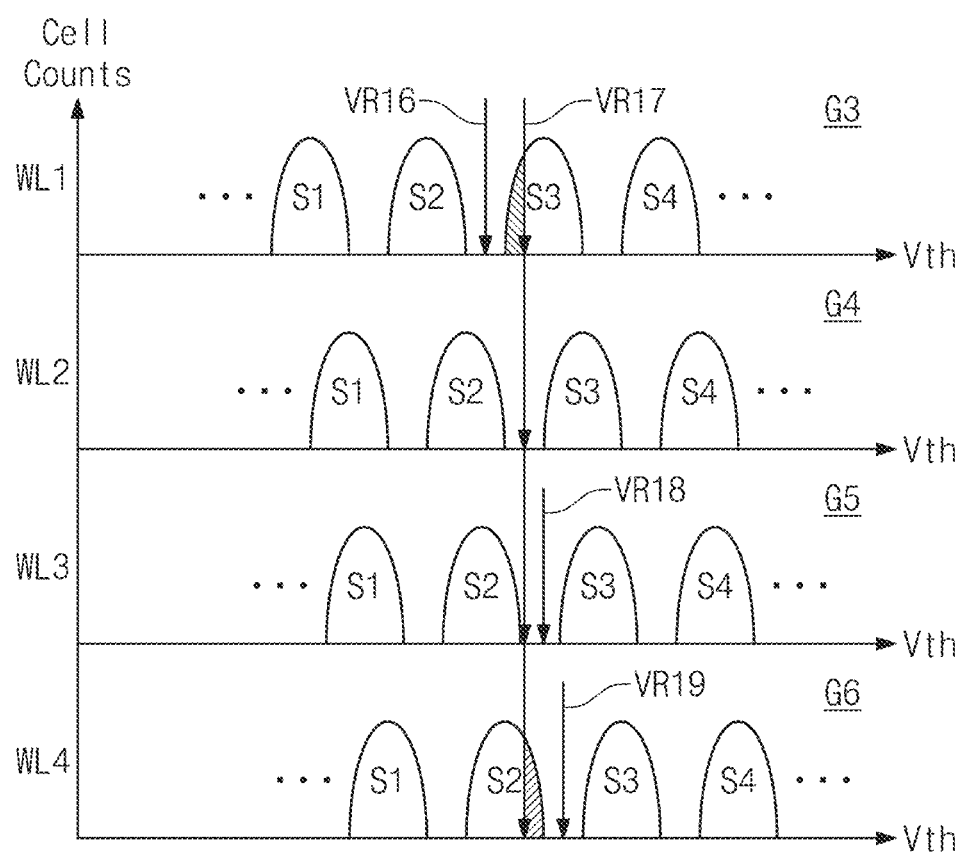
FIG. 5 illustrates graphs indicating threshold voltage distributions of memory cells connected to word lines of FIG. 3.

FIG. 5 illustrates graphs indicating threshold voltage distributions of memory cells connected to word lines of FIG. 3. Graphs G3 to G6 illustrate distributions of threshold voltages of memory cells connected to the word lines WL1 to WL4, respectively. In FIG. 5, a horizontal axis represents threshold voltages of memory cells, and a vertical axis represents cell counts, that is, the number of memory cells. The word lines WL1 to WL4 may be included in one block of the non-volatile memory 120 described with reference to FIGS. 1 and 3. The word lines WL1 to WL4 may be a subset of the word lines of one block. Only a subset of states S1 to S4 of a plurality of states are illustrated in FIG. 5.

As the degree of integration of the non-volatile memory 120 increases, the number of bits stored in a memory cell may increase; and as the number of word lines or layers of a block stacked in a vertical direction increases, deterioration of the memory cell may become worse (e.g., may occur at an accelerated rate). In particular, even though memory cells are included in the same block, a shift of a threshold voltage distribution of the memory cells tends to vary for each word line (e.g., a word line variation). That is, the rate and/or the degree of deterioration of the memory cells, and hence the shift of the threshold voltage distributions of the memory cells, may be different for different word lines.

Referring to FIG. 5, the graphs G3 to G6 respectively indicating distributions of threshold voltages of memory cells connected to the word lines WL1 to WL4 may be different from each other. In FIG. 5, it is assumed that a read level initially set for determining the states S2 and S3 is V17 and that the read level V17 is applied to all word lines of a block. When the read level V17 is applied to the word lines WL2 and WL3, the states S2 and S3 of memory cells connected to the word lines WL2 and WL3 may be determined or identified. However, when the read level V17 is applied to the word lines WL1 and WL4, the states S2 and S3 of memory cells connected to the word lines WL1 and WL4 may not be appropriately determined or identified (this means that an error occurs at memory cells included in the shaded portion in FIG. 5).

Accordingly, the states S2 and S3 may be determined or identified upon applying a read level VR16 that is different from (e.g., less than) the read level VR17 to the word line WL1 and applying a read level VR19 that is different from (e.g., greater than) the read level VR17 to the word line WL4. That is, an optimum read level may be applied for each word line, respectively. According to some example embodiments, the read level VR16 may be applied to the word line WL1, the read level VR17 may be applied to the word line WL2, the read level VR18 may be applied to the word line WL3, and the read level VR19 may be applied to the word line WL4. The read level VR18 may be greater than the read level VR17 and less than the read level VR19, for example.

The state monitoring unit 111 may check an OCC indicating a deterioration state of a block in which the word lines WL1 to WL4 are arranged. The state-based inference unit 112 may calculate an optimum read level (e.g., VR16) for determining the states S2 and S3 based on an OCC of a block and a number of the word line WL1. The state-based inference unit 112 may also calculate optimum read levels for determining any other states (e.g., S1, S4, etc.) as well as the states S2 and S3, based on the OCC of the block and the number of the word line WL1. As in the word line WL1, the state-based inference unit 112 may calculate optimum read levels (e.g., VR17, VR18, and VR19) for the word lines WL2, WL3, and WL4 based on the OCC of the block and numbers of the word lines WL2, WL3, and WL4, respectively. Accordingly, optimum (or improved) read levels capable of coping with various shift of the threshold voltage distributions due to the actual usage patterns and the actual usage environment may be determined and stored (or updated) dynamically over time, instead of the changed read levels being determined and stored in advance based on an average usage pattern and a typical usage environment.

Figure 6:
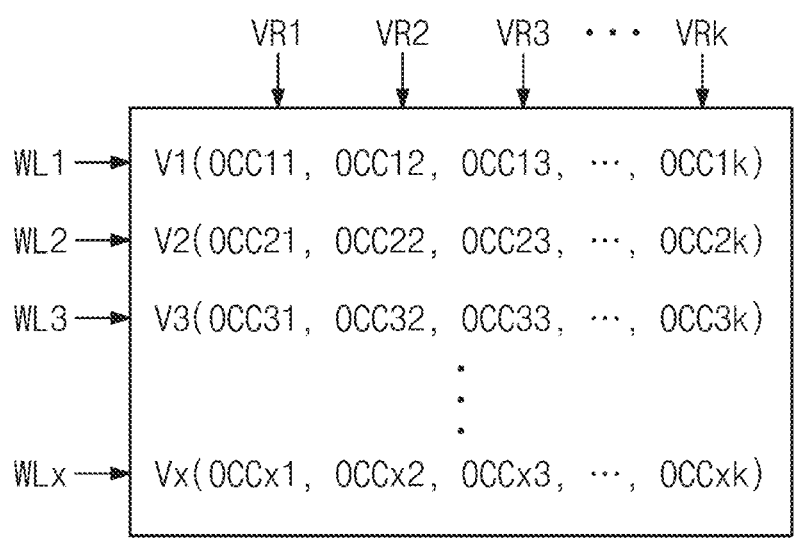
FIG. 6 illustrates how to express word lines with vectors for selecting one of the word lines of a block as a reference word line, according to some example embodiments of the inventive concepts.

FIG. 6 illustrates how to express word lines with vectors for selecting one of the word lines of a block as a reference word line, according to some example embodiments of the inventive concepts. Word lines WL1 to WLx of FIG. 6 may be included in one block of the non-volatile memory 120 described with reference to FIGS. 1 and 3, and "x" may be a natural number of 2 or more. As described above, OCCs of a block may be read by applying a read level to a reference word line of the block. One of the word lines WL1 to WLx of the block may be selected as the reference word line so that the OCCs of the reference word line indicate a deterioration state of the block.

The controller 110 may apply read levels VR1 to VRk to the word lines WL1 to WLx, respectively, for selecting the reference word line. The read levels VR1 to VRk of FIG. 6 are different from the read levels VR1 to VR15 and VR16 to VR19 of FIGS. 4 and 5. The read levels VR1 to VRk may be different from each other and may be within a range of threshold voltages of memory cells, and "k" may be a natural number of 2 or more. The number of read levels VR1 to VRk and a difference between the read levels VR1 to VRk may be determined in advance. OCCs of the word lines WL1 to WLx read by respectively applying the read levels VR1 to VRk to the word lines WL1 to WLk may be vector components of the word lines WL1 to WLx.

For example, components of a vector V1 of the word line WL1 may include OCC11 read by the read level VR1, OCC12 read by the read level VR2, OCC13 read by the read level VR3, and OCC1k read by the read level VRk. Components of vectors V2 to Vk of the remaining word lines WL2 to WLk may be generated in a similar manner as the components of the vector V1 of the word line WL1. The components of the vector V2 of the word line WL2 may include OCC21 to OCC2k, the components of the vector V3 of the word line WL3 may include OCC31 to OCC3k, and the components of the vector Vx of the word line WLx may include OCCx1 to OCCxk.

In some example embodiments, a sum of vector-based similarities between the word lines WL1 to WLx may be calculated to check similarities of the word lines WL1 to WLx. First, a description will be given with regard to the word line WL1. A sum of vector-based similarities between the word line WL1 and the remaining word lines WL2 to WLx may be calculated by adding a similarity between the word line WL1 and the word line WL2, a similarity between the word line WL1 and the word line WL3, and a similarity between the word line WL1 and the word line WLx. In a similar manner, a sum of vector-based similarities associated with each of the word lines WL2 to WLx may be calculated.

One of the word lines WL1 to WLx may be selected as a reference word line based on the sums of the vector-based similarities. For example, in a case where the word line WL3 is selected as the reference word line, a sum of vector-based similarities between the word line WL3 and the remaining word lines WL1, WL2, and WL4 to WLx may be maximum. A sum of vector-based similarities associated with the word line WL3 may be greater than sums of vector-based similarities associated with the remaining word lines WL1, WL2, and WL4 to WLx. The word line WL3 may be the reference word line, and OCCs of the word line WL3 may represent or indicate a deterioration state of a block.

As described above, one of the word lines WL1 to WLx of a block is selected as a reference word line. The blocks BLK1 to BLKn of FIG. 1 may be manufactured identically to each other, and numbers of reference word lines of the blocks BLK1 to BLKn may be identical to each other. That is, a location of a reference word line of the first block BLK1 may be identical to locations of reference word lines of the remaining blocks BLK2 to BLKn. In the case where a reference word line of a block is selected, the controller 110 may apply a read level only to the reference word line of the block, not to all of the word lines of the block, for monitoring OCCs of the block. Accordingly, an amount of time to monitor OCCs of a block may decrease, and the amount of OCCs to be stored in the buffer memory 130 may decrease.

Figure 7:
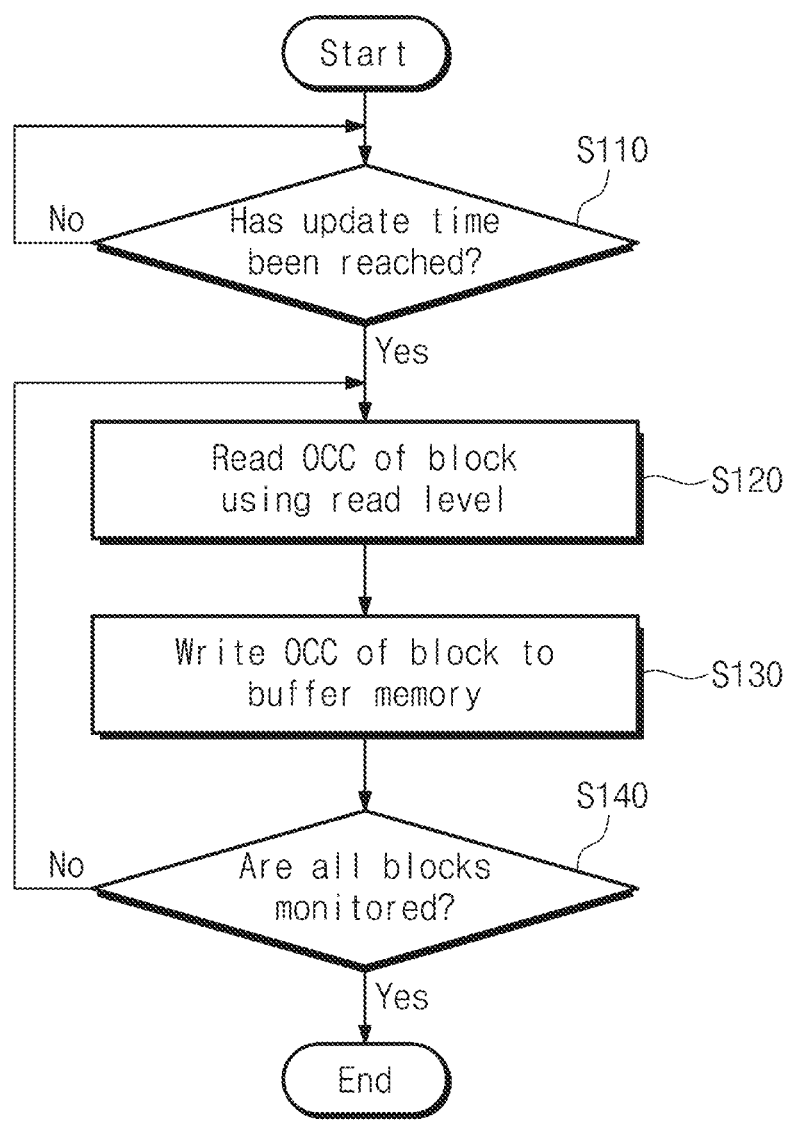
FIG. 7 illustrates a flowchart of an operating method of a storage device according to some example embodiments of the inventive concepts.

FIG. 7 illustrates a flowchart of an operating method of a storage device according to some example embodiments of the inventive concepts. An operating method of a storage device of FIG. 7 relates to a method of periodically monitoring OCCs of the blocks BLK1 to BLKn of the non-volatile memory 120 illustrated in FIG. 1.

In operation S110, the controller 110 may determine whether an update time for checking OCCs of blocks has been reached. When an update period determined in advance has elapsed ("Yes" at S110), the controller 110 repeatedly performs operations S120 to S140 to periodically update OCCs stored in the buffer memory 130. Also, the controller 110 may further determine whether a request of a host does not exist. The operation of updating and monitoring the OCCs may be performed as a background operation of the storage device 100 without a request of the host. The storage device 100 according to some example embodiments may maintain the quality of service (QoS) for the host while monitoring and storing the OCCs of the blocks.

In operation S120, the controller 110 may read an OCC of a block by using a read level. The state monitoring unit 111 of the controller 110 may apply the read level to a reference word line of the block and may read an OCC of the reference word line. The controller 110 may transmit a command (or a request) for acquiring the OCC to the non-volatile memory 120. The controller 110 may receive read data from the non-volatile memory 120 that receives the command and may calculate the OCC of the reference word line based on the read data. The OCC of the reference word line may correspond to an OCC of the block. As described above, the OCC may indicate the number of memory cells, which are turned on (or turned off) by the read level, from among memory cells connected to the reference word line. For example, the number of read levels to be applied to the reference word line may be at least 2, and two or more OCCs may be monitored by the state monitoring unit 111 for each block.

In operation S130, the controller 110 may write the OCC of the block monitored in operation S120 in the buffer memory 130. Thus, as the above-described deterioration occurs over time, the OCC of the reference word line may be periodically updated in the buffer memory 130. As described above, since a read operation is performed only on the reference word line of the block, not on all of the word lines of the block, by using the read level, the amount of OCCs to be stored in the buffer memory 130 may decrease.

In operation S140, the controller 110 may determine whether all blocks of the non-volatile memory 120 are monitored. In some example embodiments, the controller 110 may determine whether all blocks of a plurality of non-volatile memories 120 included in the storage device 100 are monitored. When the controller 110 determines that all of the blocks have not yet been monitored ("No" at S140), the controller 110 may repeatedly perform operation S120, operation S130, and operation S140 until all of the blocks have been monitored ("Yes" at S140). The controller 110 may periodically perform operation S120 and operation S130 for updating the OCCs. As described above, since the operation of periodically monitoring OCCs is a background operation, an order in which blocks of the storage device 100 are monitored and accessed may be determined in advance. The controller 110 may sequentially monitor OCCs of the blocks of the non-volatile memory 120.

In some example embodiments, upon receiving a request for a target word line of a target block from a host, the controller 110 may input the OCC1 and the OCC2 of the target block and a number of the target word line to an artificial neural network model and may infer optimum read levels for reading data of memory cells connected to the target word line. After operations S110 to S140 are performed, the controller 110 may again receive the request for the target word line of the target block from the host. In a case where a result of the periodic monitoring of the OCCs of the blocks of the non-volatile memory 120 indicates the OCC1 and the OCC2 of the target block are changed, the optimum read level for the target word line inferred by the controller 110 may also be changed. That is, an optimum read level before updating an OCC may be different from an optimum read level after updating the OCC. On the other hand, in a case where an OCC is not changed through an update, an optimum read level inferred by the controller 110 may not be changed.

Figure 8:
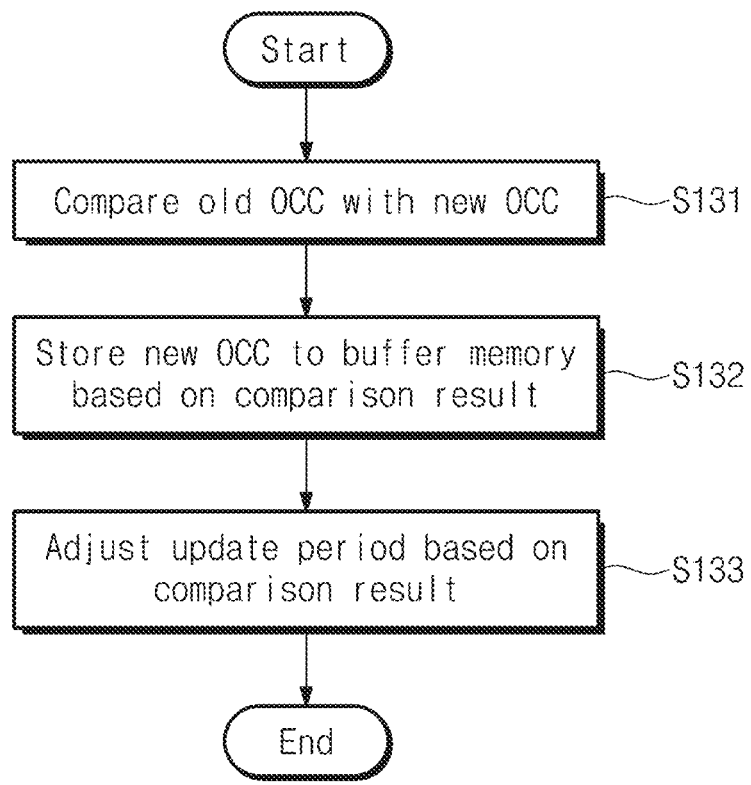
FIG. 8 illustrates a flowchart of sub-operations included in operation S130 of FIG. 7.

FIG. 8 illustrates a flowchart of sub-operations included in operation S130 of FIG. 7. In sub-operation S131, the monitoring write unit 111_2 may compare a new OCC of a block read by the monitoring read unit 111_1 with an old OCC (a previous OCC corresponding to the new OCC) of the block previously stored in the buffer memory 130.

In sub-operation S132, the monitoring write unit 111_2 may store (update) the new OCC in the buffer memory 130 instead of the previous OCC, based on a comparison result of sub-operation S131. For example, only in a case where a difference between the new OCC and the previous OCC is greater than a threshold value, the monitoring write unit 111_2 may store the new OCC in the buffer memory 130. On the other hand, in a case where the difference between the new OCC and the previous OCC is less than the threshold value, this may mean that a deterioration state of the block is relatively less severe, and the monitoring write unit 111_2 may not store the new OCC in the buffer memory 130 (that is, the old OCC corresponding to the new OCC that was previously stored remains stored in the buffer memory 130). Accordingly, through sub-operation S132, the number of times that the buffer memory 130 is accessed by the controller 110 to store the new OCC in the buffer memory 130 may be reduced, and an amount of time to access the buffer memory 130 may be reduced.

In sub-operation S133, the monitoring write unit 111_2 may adjust an update period for monitoring an OCC, based on the comparison result of sub-operation S131. For example, the monitoring write unit 111_2 may calculate differences between new OCCs and previous OCCs of blocks, and may increase the update period when a sum of the differences is less than a threshold value. In a case where the sum of the differences is less than the threshold value, this may mean that deterioration states of the blocks are relatively less severe, and the controller 110 may monitor the OCCs of the blocks relatively slowly according to the increased update period. That is, when the deterioration states of the blocks are relatively less severe, the periodic monitoring and updating of the OCCs of the blocks may be performed less frequently by increasing the update period, thereby reducing consumption of computing resources and improving efficiency of the operating method of the storage device 100.

Figure 9:
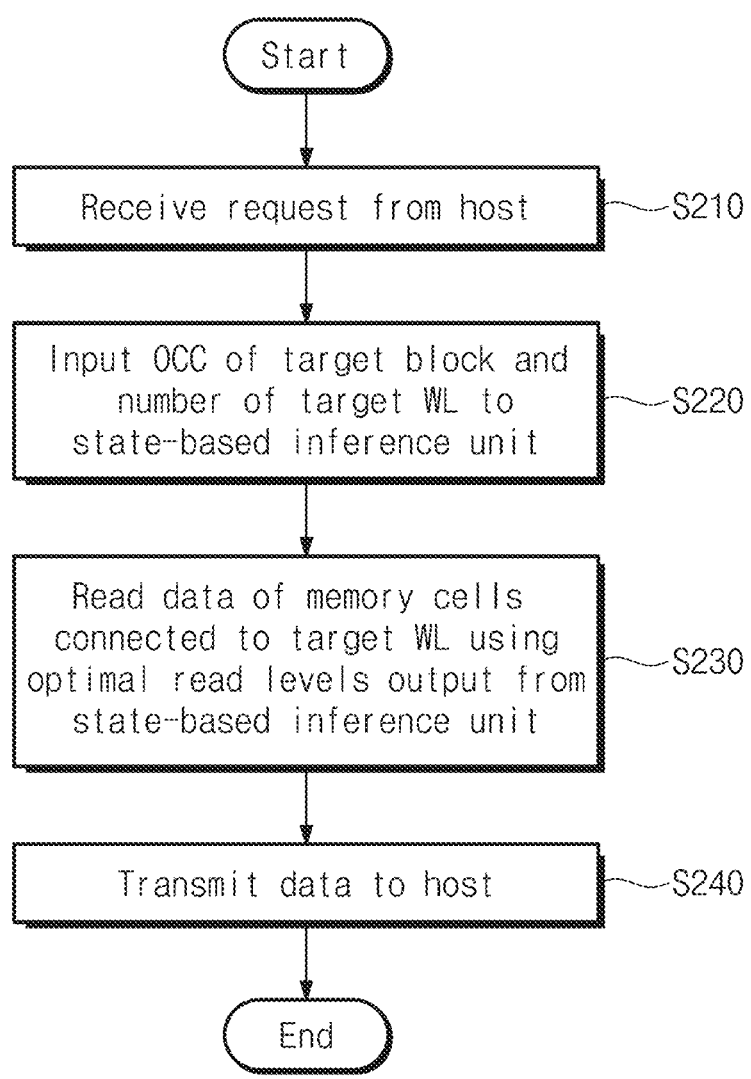
FIG. 9 illustrates a flowchart of an operating method of a storage device according to some example embodiments of the inventive concepts.

FIG. 9 illustrates a flowchart of an operating method of a storage device according to some example embodiments of the inventive concepts.

In operation S210, the controller 110 of the storage device 100 may receive a request from a host. For example, the host may request the storage device 100 to output data. When the request is received from the host while the controller 110 is performing operations S120 to S140 described above, the controller 110 may suspend (e.g., temporarily pause) performing operations S120 to S140, may first process the request of the host, and may then resume performing operations S120 to S140. Also, even though the update time described in operation S110 has been reached, in the case where a request is received from the host, the controller 110 may first process the request of the host before performing the periodic monitoring and updating of the OCCs of the blocks. That is, although the update period for monitoring the OCCs may have elapsed, the controller 110 may first process the request of the host corresponding to operation S210 of FIG. 9, instead of performing operations S120 to S140 of FIGS. 7-8.

In operation S220, the controller 110 may input a number of a target word line corresponding to the request of the host and an OCC of a target block to which the target word line belongs, to the state-based inference unit 112. The state-based inference unit 112 may calculate optimum read levels for the target word line based on the OCC of the target block and the number of the target word line, and may output the optimum read levels for the target word line. The controller 110 may then provide the optimum read levels to the non-volatile memory 120.

In operation S230, the controller 110 may read data of memory cells connected to the target word line by using the optimum read levels output from the state-based inference unit 112 and provided to the non-volatile memory 120. The non-volatile memory 120 may read data of memory cells connected to the target word line by using the optimum read levels provided from the controller 110, and may output the read data to the controller 110. In some example embodiments, a latency (or delay) for the non-volatile memory 120 to output read data in response to a command of the controller 110 corresponding to the host request of operation S210 may be longer than a latency (or delay) for the non-volatile memory 120 to output read data in response to a command of the controller 110 of operation S120 for acquiring (reading) an OCC of a block.

In operation S240, the controller 110 may transmit the data read in operation S230 to the host. Thus, the controller 110 may process the host request of operation S210. In some example embodiments, upon receiving a host request, the controller 110 may infer, predict, or calculate optimum read levels for a target word line. Accordingly, even though the deterioration of a block of the non-volatile memory 120 progresses, a read retry count may be minimized (or reduced), and a read reclaim operation associated with the deterioration-progressing block may be delayed maximally (or performed less frequently).

According to some example embodiments of the inventive concepts, an OCC indicating a deterioration state of a block may be monitored and stored (or updated) by using a read level for a reference word line. Since optimum read levels may be inferred based on the OCC, the number of times of occurrence of a read retry event of a storage device and the number of times of occurrence of a read reclaim event of the storage device may decrease, and thus, the performance and reliability of the storage device may be improved.

While the inventive concepts have been described with reference to some example embodiments thereof, it will be apparent to those of ordinary skill in the art that various changes and modifications may be made thereto without departing from the spirit and scope of the inventive concepts as set forth in the following claims.

What is claimed is:

1. A storage device comprising:
a non-volatile memory comprising a plurality of blocks;
a plurality of word lines arranged in each of the plurality of blocks;
a buffer memory; and
a controller configured to,
   store an on-cell count in the buffer memory, the on-cell count indicating a number of memory cells, which are turned on by a read level applied to a reference word line among the plurality of word lines, from among memory cells connected to the reference word line,
   perform an update of the on-cell count, and
   adjust an update period for the update based on a difference between a value of the on-cell count after the update and a value of the on-cell count before the update.

2. The storage device of claim 1, wherein the memory cells that are turned on by the read level have threshold voltages that are lower than the read level.

3. The storage device of claim 1, wherein the controller is configured to store the on-cell count in the buffer memory without a request of a host.

4. The storage device of claim 1, wherein
the controller is further configured to transmit a first command for acquiring the on-cell count and a second command corresponding to a request of a host to the non-volatile memory, and
a first latency for the non-volatile memory to output first read data in response to the first command is shorter than a second latency for the non-volatile memory to output second read data in response to the second command.

5. The storage device of claim 1, wherein
the controller is further configured to obtain vectors for the plurality of word lines, each of the vectors having a component indicating a number of memory cells, which are turned on by the read level applied to corresponding one of the plurality of word lines,
one of the plurality of word lines is selected as the reference word line depending on sums of vector-based similarities between the plurality of word lines using the vectors, and
a sum of the vector-based similarities between the one of the plurality of word lines selected as the reference word line and remaining word lines among the plurality of word lines is maximum among the sums of vector-based similarities between the plurality of word lines.

6. The storage device of claim 1, wherein
the plurality of blocks comprise a first block and a second block, and
a first location of a first reference word line of the first block is identical to a second location of a second reference word line of the second block.

7. The storage device of claim 1, wherein the read level is within a range of threshold voltage levels of the memory cells.

8. The storage device of claim 1, wherein
the read level is a first read level, and the on-cell count is a first on-cell count, and
the controller is further configured to store a second on-cell count in the buffer memory, the second on-cell count indicating a number of memory cells, which are turned on by a second read level applied to the reference word line, from among the memory cells connected to the reference word line, the second read level being different from the first read level.

9. The storage device of claim 8, wherein
the first read level for acquiring the first on-cell count is determined according to a correlation with lower read levels among a plurality of read levels for determining data of the memory cells connected to the reference word line, and
the second read level for acquiring the second on-cell count is determined according to a correlation with upper read levels among the plurality of read levels.

10. The storage device of claim 1, wherein each of the plurality of blocks corresponds to a unit by which the controller erases data of memory cells of the non-volatile memory.

11. A storage device comprising:
a non-volatile memory comprising a plurality of blocks;
a plurality of word lines arranged in each of the plurality of blocks;

a buffer memory; and a controller configured to, periodically read memory cells connected to a reference word line among the plurality of word lines by applying a read level to the reference word line, and periodically perform an update an on-cell count in the buffer memory, the on-cell count indicating a number of memory cells, which are turned on by applying the read level to the reference word line, from among the memory cells connected to the reference word line, wherein the update is performed as a background operation of the storage device without a request of a host.

12. The storage device of claim 11, wherein the controller is further configured to compare a new on-cell count indicating a number of memory cells, which are turned on by applying the read level to the reference word line after the on-cell count is stored in the buffer memory, from among the memory cells connected to the reference word line, with the on-cell count stored in the buffer memory.

13. The storage device of claim 12, wherein the controller is further configured to store the new on-cell count in the buffer memory, instead of the on-cell count stored in the buffer memory, in response to a difference between the new on-cell count and the on-cell count stored in the buffer memory being greater than a threshold value.

14. The storage device of claim 12, wherein the controller is further configured to adjust an update period for monitoring the on-cell count, in response to a sum of differences between the new on-cell count and the on-cell count stored in the buffer memory for each of the plurality of blocks being less than a threshold value.

15. The storage device of claim 11, wherein an update period for monitoring the on-cell count is a value determined in advance.

16. The storage device of claim 11, wherein the buffer memory includes a dynamic random access memory (DRAM), a static random access memory (SRAM), or a tightly coupled memory (TCM).

17. An operating method of a storage device, which includes a non-volatile memory comprising a plurality of blocks, a plurality of word lines arranged in each of the plurality of blocks, a buffer memory, and a controller, the method comprising:

selecting reference word lines from the plurality of word lines arranged in each of the plurality of blocks;

sequentially monitoring, by the controller, on-cell counts of the plurality of blocks by reading memory cells connected to the reference word lines of the plurality of blocks of the non-volatile memory by applying a read level to the reference word lines; and storing, by the controller, the on-cell counts of the plurality of blocks in the buffer memory, the on-cell counts indicating a number of memory cells, which are turned on by applying the read level to the reference word lines, from among the memory cells connected to the reference word lines, performing, by the controller, an update of the on-cell counts, and adjusting an update period for the update based on a difference between values of the on-cell counts after the update and values of the on-cell counts before the update.

18. The method of claim 17, further comprising:

receiving, by the controller, a request from a host communicating with the storage device; and processing, by the controller, the request of the host before performing the sequential monitoring of the on-cell counts and the storing of the on-cell counts in the buffer memory.

19. The method of claim 17, wherein an order in which the controller accesses the plurality of blocks to perform the sequential monitoring of the on-cell counts by applying the read level to the reference word lines is determined in advance.

20. The method of claim 17, wherein the performing the update comprising:

sequentially monitoring, by the controller, new on-cell counts of the plurality of blocks by reading the memory cells connected to the reference word lines by applying the read level to the reference word lines after storing the on-cell counts in the buffer memory; and storing, by the controller, the new on-cell counts of the plurality of blocks in the buffer memory, the new on-cell counts indicating a number of memory cells, which are turned on by applying the read level to the reference word lines after storing the on-cell counts in the buffer memory, from among the memory cells connected to the reference word lines.

* * * * *